(12) United States Patent
Place

(10) Patent No.: US 8,965,290 B2
(45) Date of Patent: Feb. 24, 2015

(54) AMPLITUDE ENHANCED FREQUENCY MODULATION

(75) Inventor: Richard Alan Place, Rochester, NY (US)

(73) Assignee: General Electric Company, Schenectady, NY (US)

( * ) Notice: Subject to any disclaimer, the term of this patent is extended or adjusted under 35 U.S.C. 154(b) by 287 days.

(21) Appl. No.: 13/434,828

(22) Filed: Mar. 29, 2012

(65) Prior Publication Data

US 2013/0259148 A1  Oct. 3, 2013

(51) Int. Cl.
*H04B 1/00* (2006.01)

(52) U.S. Cl.
USPC .................. 455/42; 455/23; 375/261

(58) Field of Classification Search
CPC ....... H04B 14/006; H04B 7/165; H04L 27/38
USPC .......................................................... 455/42
See application file for complete search history.

(56) References Cited

U.S. PATENT DOCUMENTS

| | | | | |
|---|---|---|---|---|
| 3,714,577 A * | 1/1973 | Hayes | ........................... | 455/102 |
| 3,766,477 A * | 10/1973 | Cook | ........................... | 375/130 |
| 3,983,487 A * | 9/1976 | Ohno | ........................... | 455/142 |
| 4,079,204 A * | 3/1978 | Takahashi et al. | ........................... | 381/16 |
| 4,223,282 A * | 9/1980 | de Boer | ........................... | 332/183 |
| 4,305,159 A * | 12/1981 | Stromswold et al. | ...... | 455/226.1 |
| 4,312,064 A * | 1/1982 | Bench et al. | ........................... | 370/488 |
| 4,358,853 A * | 11/1982 | Qureshi | ........................... | 375/296 |
| 4,593,410 A * | 6/1986 | Kyrian | ........................... | 455/109 |
| 4,680,749 A * | 7/1987 | Englund et al. | ........................... | 370/204 |
| 4,866,779 A * | 9/1989 | Kennedy et al. | ........................... | 381/94.2 |
| 4,878,251 A * | 10/1989 | Richardson | ........................... | 455/206 |
| 5,058,202 A * | 10/1991 | Leveque | ........................... | 455/43 |
| 5,133,083 A * | 7/1992 | Crilly et al. | ........................... | 455/45 |
| 5,159,282 A * | 10/1992 | Serizawa et al. | ........................... | 329/316 |
| 5,185,679 A * | 2/1993 | Mishima et al. | ........................... | 360/30 |
| 5,214,708 A * | 5/1993 | McEachern | ........................... | 704/266 |
| 5,220,427 A * | 6/1993 | Mikami | ........................... | 348/678 |
| 5,283,531 A * | 2/1994 | Serizawa et al. | ........................... | 329/316 |
| 5,357,284 A * | 10/1994 | Todd | ........................... | 348/486 |
| 5,444,561 A * | 8/1995 | Kaminishi | ........................... | 398/155 |
| 5,465,396 A * | 11/1995 | Hunsinger et al. | ........................... | 455/61 |
| 5,501,105 A * | 3/1996 | Hernandez et al. | ........................... | 73/660 |
| 5,574,755 A * | 11/1996 | Persico | ........................... | 375/295 |
| 5,621,345 A * | 4/1997 | Lee et al. | ........................... | 327/254 |
| 5,642,358 A * | 6/1997 | Dent | ........................... | 370/323 |
| 5,805,583 A * | 9/1998 | Rakib | ........................... | 370/342 |
| 5,825,242 A * | 10/1998 | Prodan et al. | ........................... | 329/304 |
| 5,828,692 A * | 10/1998 | Walley | ........................... | 375/130 |
| 5,850,415 A * | 12/1998 | Hunsinger et al. | ........................... | 375/216 |
| 5,864,550 A * | 1/1999 | Posti | ........................... | 370/338 |
| 5,893,030 A * | 4/1999 | De Loe et al. | ........................... | 455/321 |
| 5,949,796 A * | 9/1999 | Kumar | ........................... | 370/529 |
| 5,956,373 A * | 9/1999 | Goldston et al. | ........................... | 375/298 |
| 5,966,376 A * | 10/1999 | Rakib et al. | ........................... | 370/342 |
| 6,023,306 A * | 2/2000 | Limberg | ........................... | 348/726 |
| 6,101,312 A * | 8/2000 | Funayama | ........................... | 386/269 |
| 6,118,479 A * | 9/2000 | Maeda et al. | ........................... | 348/192 |

(Continued)

*Primary Examiner* — Hai V Nguyen
(74) *Attorney, Agent, or Firm* — Fletcher Yoder, P.C.

(57) ABSTRACT

Methods and systems for transmitting a spectrally efficient signal. The method includes frequency modulating an input signal in a transmitter to generate a first frequency modulated (FM) signal and generating in the transmitter an amplitude modulated (AM) component based at least on the input signal. The method may then include generating a second FM signal based at least on the AM component and the first FM signal and sending the second FM signal to a receiver.

20 Claims, 3 Drawing Sheets

(56) References Cited

U.S. PATENT DOCUMENTS

| | | | |
|---|---|---|---|
| 6,208,848 B1* | 3/2001 | Bertrana | 455/218 |
| 6,243,424 B1* | 6/2001 | Kroeger et al. | 375/265 |
| 6,259,893 B1* | 7/2001 | Kroeger et al. | 455/61 |
| 6,313,885 B1* | 11/2001 | Patel et al. | 348/725 |
| 6,351,500 B2* | 2/2002 | Kumar | 375/270 |
| 6,433,835 B1* | 8/2002 | Hartson et al. | 348/608 |
| 6,470,055 B1* | 10/2002 | Feher | 375/259 |
| 6,483,286 B1* | 11/2002 | Bi et al. | 324/76.39 |
| 6,510,175 B1* | 1/2003 | Hunsinger et al. | 375/216 |
| 6,590,944 B1* | 7/2003 | Kroeger | 375/340 |
| 6,608,869 B1* | 8/2003 | Limberg | 375/261 |
| 6,720,839 B1* | 4/2004 | Torre et al. | 332/103 |
| 6,721,337 B1* | 4/2004 | Kroeger et al. | 370/477 |
| 6,819,708 B1* | 11/2004 | Lim et al. | 375/146 |
| 6,847,255 B2* | 1/2005 | Petrovic et al. | 329/323 |
| 6,853,690 B1* | 2/2005 | Sorrells et al. | 375/295 |
| 6,898,249 B2* | 5/2005 | Kroeger et al. | 375/259 |
| 6,925,116 B2* | 8/2005 | Liljeryd et al. | 375/240 |
| 6,928,046 B1* | 8/2005 | Sajadieh et al. | 370/203 |
| 6,950,481 B2* | 9/2005 | Limberg | 375/321 |
| 6,982,592 B2* | 1/2006 | Petrovic et al. | 329/323 |
| 7,003,094 B2* | 2/2006 | Fischer et al. | 379/406.01 |
| 7,039,372 B1* | 5/2006 | Sorrells et al. | 455/118 |
| 7,046,694 B2* | 5/2006 | Kumar | 370/487 |
| 7,107,023 B1* | 9/2006 | Derome et al. | 455/103 |
| 7,110,435 B1* | 9/2006 | Sorrells et al. | 375/147 |
| 7,110,731 B2* | 9/2006 | Derome et al. | 455/127.4 |
| 7,126,999 B2* | 10/2006 | Dent | 375/261 |
| 7,197,087 B2* | 3/2007 | Luke et al. | 375/308 |
| 7,321,751 B2* | 1/2008 | Sorrells et al. | 455/118 |
| 7,333,153 B2* | 2/2008 | Hartson et al. | 348/608 |
| 7,400,904 B2* | 7/2008 | Cornwall et al. | 455/552.1 |
| 7,409,008 B2* | 8/2008 | Simon | 375/296 |
| 7,426,246 B2* | 9/2008 | Chen et al. | 375/322 |
| 7,457,375 B2* | 11/2008 | Soga | 375/324 |
| 7,460,613 B2* | 12/2008 | Sahlman | 375/296 |
| 7,477,694 B2* | 1/2009 | Sanderford et al. | 375/261 |
| 7,477,700 B2* | 1/2009 | Cabrera | 375/295 |
| 7,532,676 B2* | 5/2009 | Fonseka et al. | 375/265 |
| 7,539,474 B2* | 5/2009 | Sorrels et al. | 455/296 |
| 7,599,421 B2* | 10/2009 | Sorrells et al. | 375/147 |
| 7,620,378 B2* | 11/2009 | Sorrells et al. | 455/118 |
| 7,639,821 B2* | 12/2009 | Zinser | 381/15 |
| 7,693,230 B2* | 4/2010 | Sorrells et al. | 375/295 |
| 7,693,502 B2* | 4/2010 | Sorrells et al. | 455/313 |
| 7,720,454 B1* | 5/2010 | Clement et al. | 455/258 |
| 7,733,980 B2* | 6/2010 | Beukema et al. | 375/300 |
| 7,773,688 B2* | 8/2010 | Sorrells et al. | 375/295 |
| 7,809,927 B2* | 10/2010 | Shi et al. | 712/36 |
| 7,894,789 B2* | 2/2011 | Sorrells et al. | 455/313 |
| 7,904,032 B2* | 3/2011 | Claessen | 455/83 |
| 7,904,110 B2* | 3/2011 | Young et al. | 455/552.1 |
| 7,920,637 B2* | 4/2011 | Fonseka et al. | 375/265 |
| 7,936,229 B2* | 5/2011 | Akhtar et al. | 332/145 |
| 8,036,304 B2* | 10/2011 | Sorrells et al. | 375/295 |
| 8,077,797 B2* | 12/2011 | Sorrells et al. | 375/295 |
| 8,184,210 B2* | 5/2012 | Sharma et al. | 348/724 |
| 8,189,646 B2* | 5/2012 | Ries et al. | 375/140 |
| 8,195,094 B1* | 6/2012 | Briskman et al. | 455/42 |
| 8,204,107 B2* | 6/2012 | Zhuang et al. | 375/240 |
| 8,223,881 B2* | 7/2012 | Meyer et al. | 375/295 |
| 8,224,281 B2* | 7/2012 | Sorrells et al. | 455/313 |
| 8,259,832 B2* | 9/2012 | Feher | 375/261 |
| 8,285,215 B2* | 10/2012 | Jones (aka Jabari) | 455/42 |
| 8,326,238 B2* | 12/2012 | Yang et al. | 455/114.3 |
| 8,363,752 B2* | 1/2013 | Lee | 375/298 |
| 8,374,233 B2* | 2/2013 | Singerl et al. | 375/238 |
| 8,385,461 B1* | 2/2013 | Pettus et al. | 375/295 |
| 8,442,466 B2* | 5/2013 | Trikha et al. | 455/260 |
| 8,497,743 B2* | 7/2013 | Dent | 333/24 R |
| 8,498,349 B2* | 7/2013 | Balakrishnan et al. | 375/260 |
| 8,594,228 B2* | 11/2013 | Sorrells et al. | 375/295 |
| 8,599,726 B2* | 12/2013 | Mikhemar et al. | 370/278 |
| 8,614,769 B2* | 12/2013 | Hafemeister | 348/729 |
| 8,660,208 B2* | 2/2014 | Brillant et al. | 375/298 |
| 8,688,045 B2* | 4/2014 | Lin et al. | 455/42 |
| 8,774,316 B2* | 7/2014 | Thompson et al. | 375/302 |
| 8,787,431 B2* | 7/2014 | Matsuura | 375/219 |
| 2003/0007583 A1* | 1/2003 | Hilton et al. | 375/350 |
| 2003/0108112 A1* | 6/2003 | Rudolph et al. | 375/261 |
| 2003/0189673 A1* | 10/2003 | Limberg | 348/725 |
| 2003/0224725 A1* | 12/2003 | Limberg | 455/23 |
| 2004/0048586 A1* | 3/2004 | Monson | 455/119 |
| 2004/0131125 A1* | 7/2004 | Sanderford et al. | 375/261 |
| 2004/0157571 A1* | 8/2004 | Wortel et al. | 455/131 |
| 2005/0063485 A1* | 3/2005 | Hasegawa et al. | 375/296 |
| 2005/0096000 A1* | 5/2005 | Petrovic et al. | 455/255 |
| 2006/0098761 A1* | 5/2006 | Leizerovich et al. | 375/303 |
| 2006/0148441 A1* | 7/2006 | Zinser | 455/336 |
| 2007/0111692 A1* | 5/2007 | Kuramoto et al. | 455/277.1 |
| 2007/0230612 A1* | 10/2007 | Ahmed | 375/295 |
| 2007/0259627 A1* | 11/2007 | Sorrells et al. | 455/118 |
| 2008/0002788 A1* | 1/2008 | Akhtar et al. | 375/298 |
| 2008/0129610 A1* | 6/2008 | Tsfati et al. | 343/702 |
| 2008/0133204 A1* | 6/2008 | Liu et al. | 703/14 |
| 2008/0137714 A1* | 6/2008 | Lionel et al. | 375/130 |
| 2008/0150687 A1* | 6/2008 | Claessen | 340/10.1 |
| 2008/0170551 A1* | 7/2008 | Zaks | 370/338 |
| 2008/0297206 A1* | 12/2008 | Payne | 327/104 |
| 2009/0160576 A1* | 6/2009 | Dent | 333/139 |
| 2009/0258612 A1* | 10/2009 | Zhuang et al. | 455/110 |
| 2009/0262877 A1* | 10/2009 | Shi et al. | 375/376 |
| 2009/0270053 A1* | 10/2009 | Bury | 455/102 |
| 2009/0279422 A1* | 11/2009 | Fonseka et al. | 370/215 |
| 2010/0073102 A1* | 3/2010 | Singerl et al. | 332/108 |
| 2011/0037643 A1* | 2/2011 | Torin et al. | 342/173 |
| 2011/0151813 A1* | 6/2011 | Hansen et al. | 455/196.1 |
| 2011/0158216 A1* | 6/2011 | Zaks | 370/338 |
| 2011/0249835 A1* | 10/2011 | Lunner et al. | 381/312 |
| 2012/0243708 A1* | 9/2012 | Tsutsui et al. | 381/98 |
| 2012/0252394 A1* | 10/2012 | Balakrishnan et al. | 455/313 |
| 2012/0321007 A1* | 12/2012 | Feher | 375/261 |
| 2013/0016794 A1* | 1/2013 | Thompson et al. | 375/295 |
| 2013/0080495 A1* | 3/2013 | Staszewski et al. | 708/670 |
| 2013/0241775 A1* | 9/2013 | Naden et al. | 342/450 |
| 2013/0259148 A1* | 10/2013 | Place | 375/261 |

* cited by examiner

AMPLITUDE ENHANCED FREQUENCY MODULATION

BACKGROUND OF THE INVENTION

The subject matter disclosed herein relates to a communication system and, in particular, to an enhanced frequency modulation (FM) technique for use in a communication system.

Frequency modulation and forms of frequency modulation, such as continuous-phase frequency-shift keying (CPFSK) and Gaussian minimum shift keying (GMSK), are widely used in data transmission systems for a variety of reasons. For instance, FM data transmission systems are easy to demodulate (e.g., do not need automatic gain control (AGC), Costas loop, or IQ mixers) and are capable of fast acquisition (i.e., no need to recover phase). Further, FM data transmission systems are robust (i.e., insensitive to linearity and impulse noise), can be employed with single chip receiver solutions, provide efficient class C power amplification (i.e., emit less heat and has longer battery life), and can be implemented at low costs.

Although FM data transmission systems provide these advantages, the FM signals produced by the FM data transmission systems are generally less spectrally efficient than signals generated by linear modulation systems, such as quadrature amplitude modulation (QAM). Generally, the spectral efficiency of FM data transmission systems may be improved by filtering a baseband modulating signal, but the improved spectral efficiency is limited due to spectral components in the FM signals that extend beyond the baseband bandwidth on each side of the FM signals. While these spectral components can be reduced by lowering the FM deviation, the reduced FM deviation also lowers the signal to noise ratio in the FM signals.

BRIEF DESCRIPTION OF THE INVENTION

In one embodiment, a communication system may include a transmitter. The transmitter may include a frequency modulator that may generate a first frequency modulated (FM) signal based at least on an input signal, a component that may generate an amplitude modulated (AM) component based at least on the input signal, and an amplitude modulator that may add the AM component to the FM signal to generate a second FM signal. The transmitter may then send the second FM signal to a receiver.

In a second embodiment, a communication system may include a transmitter that has a digital signal processor (DSP) and a complex modulator. The DSP may generate an inphase (I) signal and quadrature phase (Q) signal using a frequency modulation such that the I signal and the Q signal includes at least a first sideband component and a second sideband component. The DSP may then remove the second sideband component from the I signal and the Q signal, thereby generating a filtered I signal and a filtered Q signal. After generating the filtered I signal and the filtered Q signal, the complex modulator may generate a frequency modulated (FM) signal based in part on the filtered I signal and the filtered Q signal.

In a third embodiment, a method for transmitting a spectrally efficient signal may include frequency modulating an input signal in a transmitter to generate a first frequency modulated (FM) signal and generating an amplitude modulated (AM) component in the transmitter based at least on the input signal. The method may then include generating a second FM signal based at least on the AM component and the first FM signal and sending the second FM signal to a receiver.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure generally relates to generating a more spectrally efficient FM data transmission system. In one embodiment, an FM transmitter in an FM data transmission system may embed information into a first sideband of a carrier wave by modulating the frequency of the carrier wave. As a result, the FM transmitter may generate an FM signal that contains the embedded information within its first sideband and extraneous information within its second sideband. Since the second sideband of the FM signal does not contain any relevant information, the FM transmitter may remove the second sideband from the FM signal by adding a small amount (~3-5%) of amplitude modulation thereto. As a result, the FM signal may encompass a smaller amount of frequency spectrum than an FM signal having two sidebands, while maintaining the integrity of the embedded information. Additional details with regard to generating spectrally efficient FM signals will be discussed below with reference to FIG. 1-4.

Figure 1:
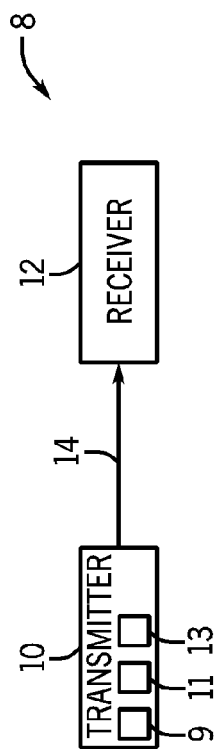
FIG. 1 illustrates an embodiment of a data transmission system.

Referring to FIG. 1, a data transmission system 8 may include a transmitter 10 and a receiver 12. The transmitter 10 may be an electronic device that produces radio frequency waves such as FM signal 14, which may be transmitted to and received by the receiver 12. Generally, the transmitter 10 may transform electric power from a battery or any electrical source into a radio frequency alternating current. The energy in such radio frequency alternating current may radiate off a conductor (e.g., an antenna) as electromagnetic waves (i.e., FM signal 14). In addition to radiating the electromagnetic waves, the transmitter 10 may also embed information, such as an audio or video signal, onto the radio frequency alternating current to be carried by the electromagnetic waves. As such, when these electromagnetic waves strike an antenna of the receiver 12, they produce similar radio frequency alternating currents in the receiver's antenna. The radio frequency alternating currents are thus received by the receiver 12, which may extract the embedded information from the electromagnetic waves.

These electromagnetic waves (e.g., radio frequency waves) may be used in broadcasting and various products that communicate by radio, such as cell phones, wireless computer networks, Bluetooth enabled devices, garage door openers, two-way radios in aircraft, ships, and spacecraft, radar sets, navigational beacons, and the like.

In one embodiment, the transmitter 10 may include a power supply circuit 9, an electronic oscillator circuit 11, and a modulator circuit 13. The power supply circuit 9 may provide an analog voltage signal to the electronic oscillator circuit 11, which may produce a sine wave of constant amplitude (i.e., carrier wave) based on the analog voltage signal. In one embodiment, the electronic oscillator circuit 11 may be a crystal oscillator in which the frequency may be precisely controlled by the vibrations of a quartz crystal.

After producing the carrier wave, the modulator circuit 13 may embed the information to be transmitted by frequency modulating the carrier wave. That process may create sidebands of the carrier wave. In a frequency modulation (FM) transmitter, the frequency of the carrier wave may be varied to produce the FM signal 14. In one embodiment, the transmitter may be a frequency-shift keying (FSK) transmitter, which may transmit digital data by shifting the frequency of a carrier wave between two frequencies that represent two binary digits (e.g., 0 and 1).

The sideband of the carrier wave in the FM signal 14 may include a band of frequencies higher than or lower than the frequency of the carrier wave and may contain power as a result of the modulation process (i.e., modulator circuit). This power corresponds to the information-carrying part of the FM signal 14. The sidebands of the FM signal 14 consist of all the Fourier components of the modulated signal except the carrier wave. For narrowband FM the relevant information may be embedded within a first order sideband of the carrier wave in the FM signal 14. Higher order sidebands, especially the second sideband, may be used to maintain a constant amplitude signal with varying frequency or phase.

After embedding the information into the sideband of the carrier wave, the transmitter 10 may transmit the embedded information (i.e., FM signal 14 with sidebands) to the receiver 12. The receiver 12 may receive the FM signal 14 and separate a part of the FM signal 14 that corresponds to the embedded information. The receiver 12 may then recover the embedded information from the FM signal 14 by demodulating and decoding the separated part of the FM signal 14.

As mentioned above, the primary function of the first sideband may include storing the embedded information. However, the primary function of the second sideband (i.e., even-order sideband) may include keeping a signal envelope of the FM signal 14 constant while the first sideband pushes the phase of the FM signal 14 back and forth. Even though the second sideband energy does not contain any embedded information, the transmitter 10 still sends the second sideband energy along with the first sideband energy in the FM signal 14 to the receiver 12. In this manner, when the receiver 12 receives this FM signal 14, the receiver 12 may remove most of the second sideband energy using a filter (e.g., intermediate frequency (IF) filter) and may demodulate or decode the first sideband energy. As such, the receiver 12 may not use the second sideband energy to demodulate the FM signal 14.

Since the receiver 12 does not use the second sideband energy to demodulate the FM signal 14, in one embodiment, the transmitter 10 may transmit just the first sideband of the FM signal 14 to the receiver 12. In this manner, the transmitted FM signal 14 would be more spectrally efficient because it included less bandwidth than the unfiltered FM signal 14. In order to transmit just the first sideband of the FM signal 14 to the receiver 12, the transmitter 10 may impose an AM component (i.e., 3-5% AM modulation) into the FM signal 14 prior to sending the FM signal 14 to the receiver 12 such that the AM component may remove even-order sidebands from the FM signal 14. By adding the small amount (−3-5%) of amplitude modulation (i.e., an AM component) to the FM signal 14, the transmitter 10 may reduce the amount of frequency spectrum occupied by the FM signal 14, thereby making a significant improvement in the FM signal spectrum's efficiency.

Figure 2:
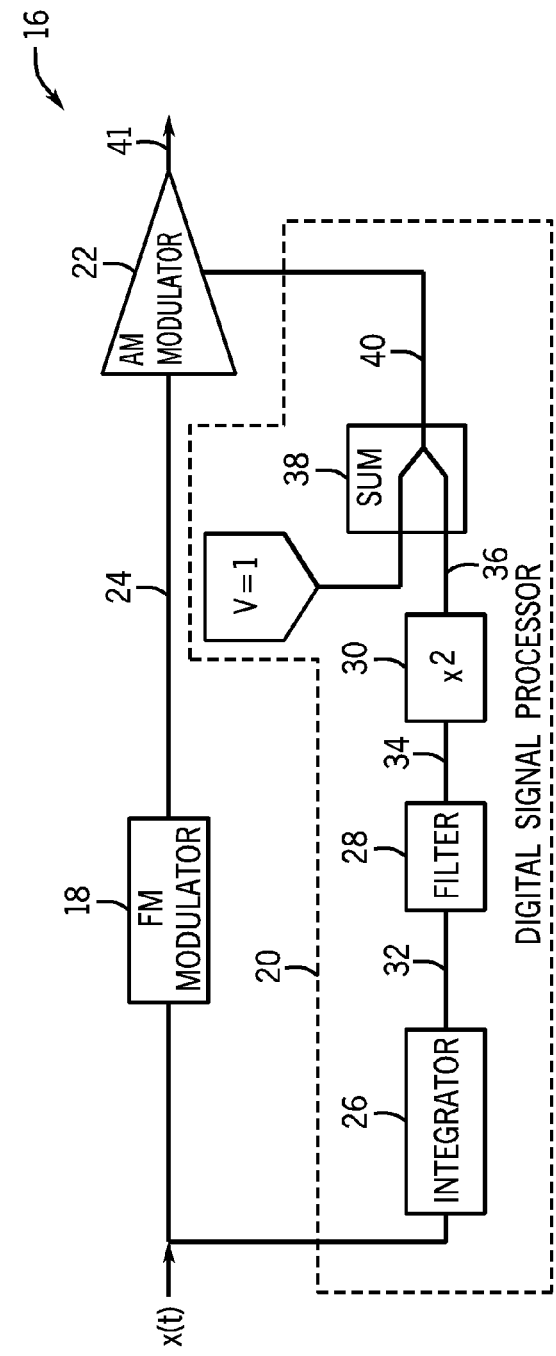
FIG. 2 illustrates a block diagram of an embodiment of an amplitude enhanced FM data transmission system.

Keeping the foregoing in mind, FIG. 2 illustrates a block diagram of an embodiment of an FM data transmission system 16 that may be used to add an AM component into the FM signal 14. In one embodiment, the FM data transmission system 16 may be incorporated into the transmitter 10 and may include an FM modulator 18, a digital signal processor (DSP) 20, and an AM modulator 22.

The FM modulator 18 may send an input signal x(t) to an integrator, which may integrate the input signal x(t). In one embodiment, integrating the input signal x(t) may include scaling the frequency component of the input signal x(t). The FM modulator 18 may then apply the integrated signal to a phase modulator circuit, which may output the sine and cosine functions of the instantaneous values of the integrated signal. The sine and cosine functions of the integrated signal may be represented using a Taylor series representation for each function, such as equations (1) and (2) as shown below.

In this manner, all odd order sidebands of the integrated signal may be produced by the sine function, while all even order sidebands of the integrated signal may be produced by the cosine function.

$$\sin(x) = x - \frac{1}{6}x^3 + \frac{1}{120}x^5 - \tag{1}$$

$$\cos(x) = 1 - \frac{1}{2}x^2 + \frac{1}{24}x^4 - \frac{1}{720}x^6 + \tag{2}$$

The output of the sine function modulates a carrier wave and produces all of the odd order sidebands (e.g., the first sideband), while the output of the cosine function modulates the carrier wave and produces all of the even order sidebands for the carrier wave (e.g., the second sideband). The FM modulator 18 may then combine the odd and even order sidebands together to produce an FM signal 24.

For a narrowband FM signal, used for most data and voice communications systems, the modulation index is less than 1, which makes higher order sidebands like the $3^{rd}$, $4^{th}$, $5^{th}$, and $6^{th}$ insignificant. Since these higher order sidebands may be considered insignificant, the FM data transmission system 16 may focus on the $x^2$ term in the Taylor Series expression for the cosine function of the FM signal 24 because the $x^2$ term produces the second sideband energy in the FM signal 24. As such, the DSP 20 may create an AM component to cancel this second sideband energy based on the $x^2$ term.

In one embodiment, the DSP 20 may include an integrator 26, a filter 28, a squaring module 30, and a summation module 32. The integrator 26 may integrate the input signal x(t) by scaling the input signal x(t) by 1/f where f is the frequency of the carrier wave. After scaling the input signal x(t), the integrator may shift the frequency component of the scaled input signal x(t) in phase by 90 degrees. As a result, the integrator 26 may produce an integrated signal 32, which may be input into the filter 28.

In one embodiment, the filter 28 may be a high pass filter that removes data in the lower half of the baseband modulation bandwidth in the integrated signal 32. The lower half of a baseband modulation bandwidth in the integrated signal 32 may be removed because only frequencies in the upper half of the baseband modulation bandwidth will produce the second sideband energy that expand the bandwidth of the FM signal 24. Conversely, the second sideband of the lower half of the baseband modulation bandwidth in the integrated signal 32 may overlap a spectrum that includes the first sideband energy of the upper baseband frequencies. By filtering the data in the lower half of a baseband modulation bandwidth in the integrated signal 32, the FM data transmission system 16 may avoid excessive AM modulation that may be of no benefit.

After filtering the integrated signal 32, the DSP 20 may double the frequency of a filtered signal 34 using the squaring module 30. As a result, the squaring module 30 may produce an AM component 36 that corresponds to the second sideband energy in the FM signal 24. The AM component 36 may then be added to a reference value (e.g., 1 volt) in the summation module 38 such that a resultant AM component 40 may be used to modulate the amplitude of the FM signal 24 using the AM modulator 22. In one embodiment, the AM modulator 22 may be a power amplifier increasing 1 mW to 5 W. As a result, the AM modulator 22 may produce a signal that represents the FM signal 24 with the resultant AM component 40 (i.e., an amplitude enhanced FM signal 41). That is, the amplitude enhanced FM signal 41 may correspond to the FM signal 24 without the second sideband energy. Although the second sideband energy in the FM signal 24 may be cancelled by adding the resultant AM component 40, this process may induce sidebands of its own. However, since these sidebands are sidebands of sidebands, their level is relatively low and the overall improvement in the spectrum of the FM signal 24 is still significant.

After generating the amplitude enhanced FM signal 41, the transmitter 10 may send the amplitude enhanced FM signal 41 (i.e., FM signal 14) to the receiver 12. As modified, the amplitude enhanced FM signal 41 consumes less bandwidth and is more spectrally efficient than an FM signal 24 without the resultant AM component 40. In this manner, the amplitude enhanced FM signal 41 may provide the ability to create a more spectrally efficient transmitter 10 without requiring a modification to existing receivers. For example, the FM signal 14 produced by the spectrally efficient transmitters 10 may be backward compatible with existing receivers. Further, the improved spectral efficiency enables more data to be sent in a given channel and/or allows data to be transferred with less interference on adjacent frequency channels. As a result, the transmitter 10 may be capable of making more spectrally efficient transmissions, while retaining all of the advantages of FM data transmission systems.

Although the FM data transmission system 16 has been described with a DSP 20, it should be noted that the resultant AM component 40 generated by the DSP 20 may also be generated by hardware components such as a finite impulse response (FIR) filter, any capable circuit, or the like. For instance, many CPFSK and GMSK transmitters may use FIR filters to process the input signal x(t) prior to applying it to an FM modulator. In one embodiment, these FIR filters may also be used generate the amplitude enhanced FM signal 41 described above. For instance, the FIR filters may be implemented as look-up tables, which generate waveforms that have been pre-computed for various bit streams that might be sent to the receiver 12. With this flexibility, the FIR filters may incorporate the integrator, filtering, squaring, and the summation functions performed by the DSP 20. In one embodiment, the look-up table may generate two outputs: the FM signal 24 and the AM component 36. The FM signal 24 can be scaled to set the desired FM deviation and the AM component 36 may be designed to generate the resultant AM component 40, which may be added to the FM signal 24 to generate the amplitude enhanced FM signal 41.

The discussion above with reference to the FM modulator 18 depicted in FIG. 2 corresponds to a conventional FM modulator, where the modulating voltage is applied to a voltage controlled oscillator. However, some modern high-performance FM transmitters generate modulation by creating individual I and Q signals (i.e., in phase signal and quadrature phase signal, respectively) and applying them to a modulator circuit consisting of two mixers operating in quadrature (i.e., separated in phase by 90 degrees). While this I-Q method may be more complex, it offers more precision to other forms of modulation. As such, it should be noted that the amplitude enhanced FM signal 41 may also be generated using I-Q based FM transmitters.

Figure 3:
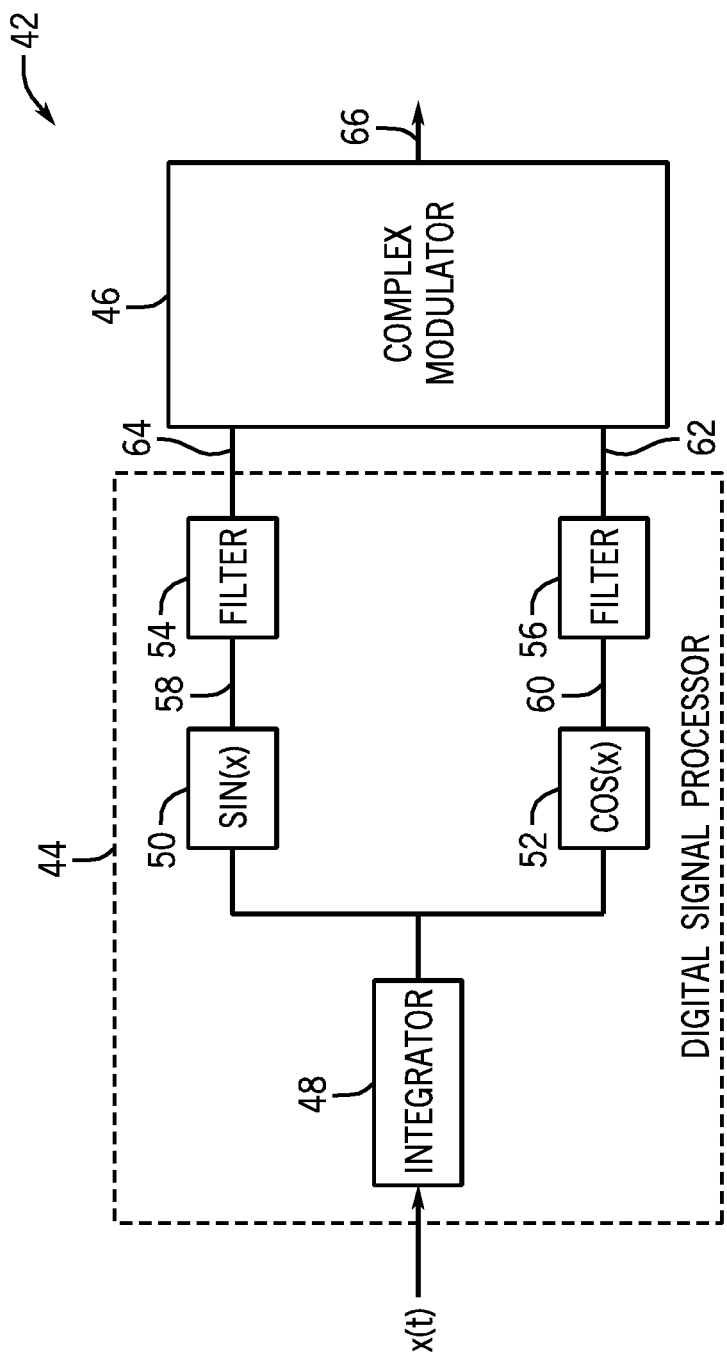
FIG. 3 illustrates a block diagram of an embodiment of an I-Q based amplitude enhanced FM data transmission system.

For instance, FIG. 3 illustrates a block diagram of an embodiment of an I-Q based amplitude enhanced FM data transmission system 42 that may be used to add an AM component into an FM signal as described above. In one embodiment, the I-Q based amplitude enhanced FM data transmission system 42 may be incorporated into the transmitter 10 and may include a digital signal processor (DSP) 44 and a complex modulator 46.

The DSP 44 may include an integrator 48, a sine module 50, a cosine module 52, and filters 54 and 56. The integrator 48 may correspond to the description of the integrator 26 of FIG. 2. In one embodiment, the integration of the input signal x(t) and the sine and cosine functions may be performed mathematically by DSP 44. For instance, the DSP 44 may perform the integration by computing a cumulative sum of input values and the sine and cosine are may be solved using a look-up table stored in a memory of the DSP 44.

The sine module 50 and the cosine module 52 may output the sine and cosine functions of the instantaneous values of the integrated signal as I signal 58 and Q signal 60, respectively. The I signal 58 and the Q signal 60 may consist of several sidebands including the first sideband. In one embodiment, when an FM modulation index is low, the I signal 58 may include the first sideband energy and the Q signal 60 may include the second sideband energy. The Q signal 60 may be input into the filter 56, which may remove the second sideband energy. As a result of removing the second sideband energy, an AM component may be added on the FM signal 66 (i.e., filtered Q signal 62). The I signal 58 may be input into the filter 54 in order to match a delay in the Q signal 60 introduced by the filter 56. Filter 54 may then generate a filtered I signal 64.

The filtered I signal 64 and the filtered Q signal 62 may then be input into the complex modulator 46. In one embodiment, the complex modulator 46 may be an integrated circuit or it may be constructed from individual components. In either case, the complex modulator 46 may include a pair of mixers such that the outputs of the mixers are summed One of the mixers in the complex modulator 46 may be driven by the filtered I signal 64, while the other may be driven by the filtered Q signal 62. The complex modulator 46 may also include a 90 degree phase shifter coupled between the two mixers, such that one of the two mixers may operate in quadrature to the other.

The complex modulator 46 may use the filtered I signal 64 and the filtered Q signal 62 to generate a compact spectrally-efficient FM signal 66 having a small AM component therein. As mentioned above, the small AM component may cancel the second sideband energy in the FM signal, thereby taking up less frequency spectrum.

In one embodiment, the bandwidth of the filters 54 and 56 may be adjusted above a minimum value to trade off spectral efficiency against amount of amplitude modulation in the compact spectrally-efficient FM signal 66. For instance, excessive AM (e.g., above 10%), is probably undesirable as non-linearity in a power amplifier could cause the spectrum to grow again, thereby reducing the spectral efficiency of the FM signal 66.

Figure 4:
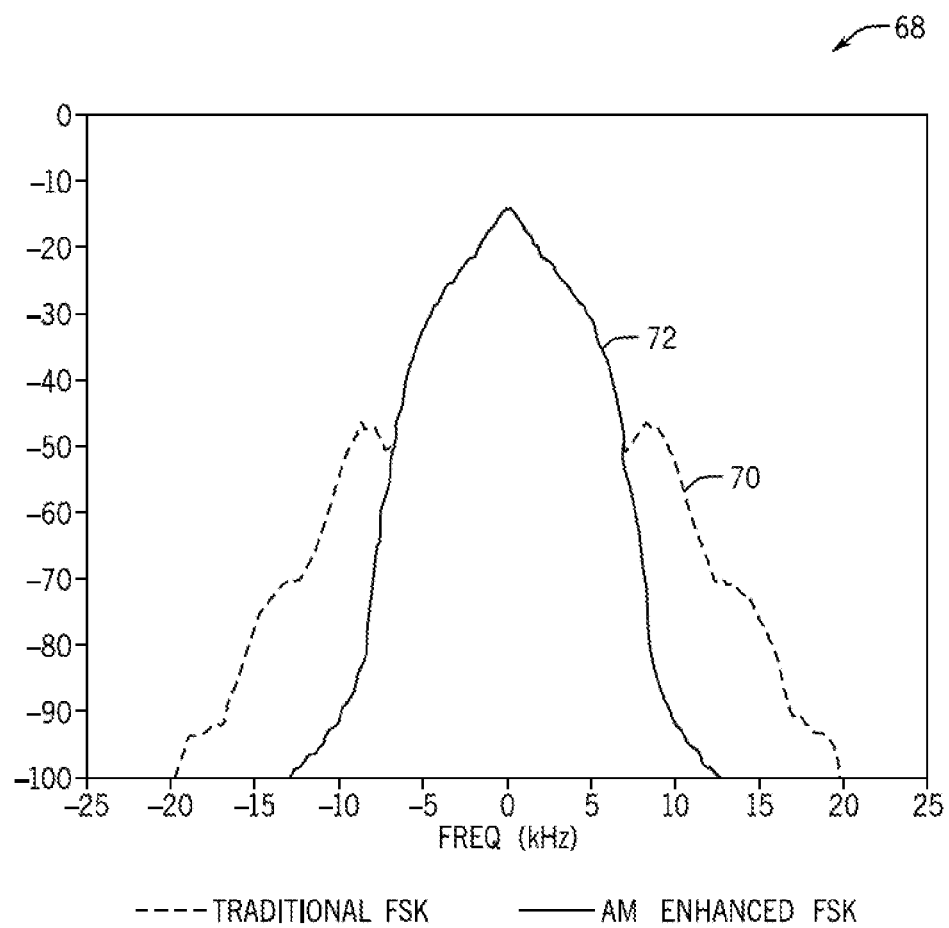
FIG. 4 illustrates examples of predicted spectrums of an FM signal produced by an FM data transmission system and an amplitude enhanced FM data transmission system.

FIG. 4 illustrates examples of predicted spectrums 68 of an FM signal produced by an FM data transmission system and an amplitude enhanced FM data transmission system, as described with reference to FIG. 2 and FIG. 3 above. In particular, FIG. 4 illustrates a predicted spectrum of a 9600 bps FSK signal with and without an AM component. As shown in FIG. 4, a traditional FSK signal 70 encompasses a frequency spectrum of approximately 40 KHz (i.e., −20 KHz to +20 KHz). In contrast, an AM enhanced FSK signal 72 encompasses a frequency spectrum of approximately 25 KHz (i.e., −12.5 KHz to +12.5 KHz). As such, the AM component added to the traditional FSK signal 70 canceled the second sideband energy in the traditional FSK signal 70, thereby making a more spectrally efficient signal.

Technical effects of this system include the ability to create a more spectrally efficient transmitter 10 without requiring a modification to existing receivers. For example, the FM signal 14 produced by the spectrally efficient transmitters 10 may be backward compatible with existing receivers. Further, the improved spectral efficiency enables more data to be sent in a given channel and/or allows data to be transferred with less interference on adjacent frequency channels. As a result, the transmitter 10 may be capable of making more spectrally efficient transmissions, while retaining all of the advantages of FM data transmission systems.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A communication system comprising:
   a transmitter, comprising:
      a frequency modulator configured to generate a first frequency modulated (FM) signal based at least on an input signal;
      a component configured to generate an amplitude modulated (AM) component based at least on the input signal; and
      an amplitude modulator configured to add the AM component to the first FM signal thereby generating a second FM signal;
   wherein the transmitter is configured to send the second FM signal to a receiver.

2. The communication system of claim 1, wherein the component comprises a digital signal processor (DSP), a circuit, a look up table, or any combinations thereof.

3. The communication system of claim 2, wherein the DSP comprises an integrator configured to integrate the input signal and generate an integrated signal.

4. The communication system of claim 3, wherein the DSP comprises a high pass filter configured to filter the integrated signal and generate a filtered signal.

5. The communication system of claim 1, wherein the AM component is configured to cancel a second sideband energy in the first FM signal.

6. The communication system of claim 1, wherein the amplitude modulator is configured to amplify the AM component.

7. A communication system comprising:
   a transmitter, comprising:
      a digital signal processor (DSP) configured to:
         generate an inphase (I) signal and quadrature phase (Q) signal using a frequency modulation, wherein the I signal and the Q signal comprise at least a first sideband component and a second sideband component; and
         remove the second sideband component from the I signal and the Q signal, thereby generating a filtered I signal and a filtered Q signal; and
      a complex modulator configured to generate a frequency modulated (FM) signal based at least on the filtered I signal and the filtered Q signal, wherein the transmitter sends the FM signal to a receiver.

8. The communication system of claim 7, wherein the DSP comprises an integrator, a sine module, a cosine module, and at least two filters.

9. The communication system of claim 8, wherein the at least two filters correspond to low pass filters.

10. The communication system of claim 8, wherein the at least two filters comprise:
    a first filter configured to remove the second sideband component from the Q signal, thereby generating an amplitude modulated (AM) component on the FM signal; and
    a second filter configured to time shift the I signal to match a delay in the Q signal introduced by the first filter.

11. A method for transmitting a spectrally efficient signal, comprising:
    frequency modulating an input signal in a transmitter to generate a first frequency modulated (FM) signal;
    generating in the transmitter an amplitude modulated (AM) component based at least on the input signal;
    generating a second FM signal based at least on the AM component and the first FM signal; and
    sending the second FM signal to a receiver.

12. The method of claim 11, wherein generating the AM component comprises:
    integrating the input signal to generate an integrated signal;
    filtering the integrated signal to generate a filtered signal;
    doubling a frequency of the filtered signal, thereby generating the AM component.

13. The method of claim 12, wherein integrating the input signal comprises:
    scaling the input signal; and
    phase shifting the scaled input signal.

14. The method of claim 13, wherein the input signal is scaled by 1/f, wherein f is a frequency of a carrier wave for the first FM signal.

15. The method of claim 13, wherein the input signal is phase shifted by 90 degrees.

16. The method of claim 12, wherein filtering the integrated signal comprises removing a lower half of a baseband modulation bandwidth in the integrated signal.

17. The method of claim 12, wherein the AM component is configured to cancel the second sideband energy in the first FM signal.

18. The method of claim 11, wherein generating the second FM signal comprises adding the AM component to the first FM signal.

19. The method of claim 11, wherein the AM component comprises about 3 to about 5 percent amplitude modulation of the input signal.

20. The method of claim 11, wherein frequency modulating the input signal in the transmitter is performed by a digital signal processor (DSP) configured to generate an inphase signal having the first FM signal, wherein generating the second FM signal is performed by a complex modulator.

* * * * *